(12) United States Patent
Ohta et al.

(10) Patent No.: US 8,749,263 B2
(45) Date of Patent: Jun. 10, 2014

(54) SEMICONDUCTOR APPARATUS, INSPECTION METHOD THEREOF AND ELECTRIC DEVICE

(75) Inventors: Masayuki Ohta, Osaka (JP); Masaki Tatsumi, Osaka (JP); Yoshiki Sota, Osaka (JP); Kazuo Tamaki, Osaka (JP); Shinji Yamaguchi, Osaka (JP); Masamichi Harada, Osaka (JP); Shin Ito, Osaka (JP); Tomoshi Kimura, Osaka (JP); Yoshifumi Inada, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 243 days.

(21) Appl. No.: 13/221,007

(22) Filed: Aug. 30, 2011

(65) Prior Publication Data

US 2012/0049882 A1 Mar. 1, 2012

(30) Foreign Application Priority Data

Aug. 30, 2010 (JP) ................................. 2010-192898

(51) Int. Cl.
*H01L 33/52* (2010.01)

(52) U.S. Cl.
USPC ............................ 324/762.01; 257/99; 257/91

(58) Field of Classification Search
USPC ............ 324/509, 512, 750.01, 750.3, 754.18, 324/755.08–755.09, 756.03–756.07, 324/757.02–757.05, 762.01–762.06, 324/763.01–763.02; 257/91, 99
See application file for complete search history.

(56) References Cited

U.S. PATENT DOCUMENTS

| 2004/0046178 | A1* | 3/2004 | Sano | 257/98 |
| 2008/0303411 | A1* | 12/2008 | Ohta et al. | 313/503 |
| 2008/0308822 | A1* | 12/2008 | Tsang et al. | 257/89 |

FOREIGN PATENT DOCUMENTS

| CN | 1495924 A | | 5/2004 | |
| JP | 10-074800 | | 3/1998 | |
| JP | 2000-091645 | | 3/2000 | |
| JP | 2001-177159 | | 6/2001 | |
| JP | 2001177159 A | * | 6/2001 | ............. H01L 33/00 |
| JP | 2006-196702 | | 7/2006 | |

OTHER PUBLICATIONS

Japanese Office Action issued in Application No. 2010-192898 dated Jan. 7, 2014.
Chinese Office Action issued in Application No. 201110254113.0 dated Dec. 4, 2013.
* cited by examiner

*Primary Examiner* — Arleen M Vazquez
*Assistant Examiner* — Brent J Andrews
(74) *Attorney, Agent, or Firm* — Nixon & Vanderhye, P.C.

(57) ABSTRACT

A semiconductor apparatus according to the present invention with a semiconductor element implemented on an insulated substrate comprises: a substrate front surface electrode formed on a front surface side of the insulated substrate and connected with an element electrode of the semiconductor element; a substrate back surface electrode formed on a back surface side of the insulated substrate and electrically connected with the substrate front surface electrode; and a plurality of connection electrodes, extending in a thickness direction of the insulated substrate from one side to the other side of a front surface and a back surface thereof, for electrically connecting the substrate front surface electrode with the substrate back surface electrode, where the substrate front surface electrode or the substrate back surface electrode is formed to have a plane pattern separated for each of the plurality of connection electrodes.

14 Claims, 10 Drawing Sheets

SEMICONDUCTOR APPARATUS, INSPECTION METHOD THEREOF AND ELECTRIC DEVICE

This nonprovisional application claims priority under 35 U.S.C. §119(a) to Patent Application No. 2010-192898 filed in Japan on Aug. 30, 2010, the entire contents of which are hereby incorporated by reference.

BACKGROUND OF THE INVENTION

1. Field of the Invention

The present invention relates to a semiconductor apparatus and an inspection method thereof as well as an electric device. For example, the present invention relates to a semiconductor apparatus of a surface mounting type, in which a semiconductor chip, such as an LED (Light Emitting Diode) chip, is implemented on an insulated substrate; a method for inspecting such a semiconductor apparatus; and an electric device using such a semiconductor apparatus.

2. Description of the Related Art

Conventionally, semiconductor light emitting diodes include a chip-type LED and a cannonball-type lamp shape LED. Such a chip-type LED, which can be a thin type, is used as a light source of various display panels, backlight of liquid crystal display apparatuses, illumination switches and the like. The chip-type LED can be implemented by adhering it without modification on a printed circuit board.

FIG. 7 is a perspective view describing a chip-type LED, which is disclosed in Reference 1.

A chip-type LED 50 is formed by implementing a light emitting element 4 on an insulated substrate 1 having a pair of electrodes 2 and 3, and by encapsulating the light emitting element 4 with a resin 6.

The insulated substrate 1 is in a shape of a rectangle in a plan view. A front surface electrode 3a for constituting one of the two electrodes, electrode 3, is formed on one of a pair of opposing edges on the surface of the rectangle, and a front surface electrode 2a for constituting the other of the two electrodes, electrode 2, is formed on the other one of the pair of opposing edges thereof. Further, a back surface electrode 3b for constituting one of the two electrodes, electrode 3, is formed on one of a pair of opposing edges on a back surface of the insulated substrate 1, and a back surface electrode 2b for constituting the other of the two electrodes, electrode 2, is formed on the other one of the pair of opposing edges thereof.

A cutout part 1a having a generally semicircular shape in a plan view is formed both on a side surface of one edge side and on a side surface of the other edge side, of the insulated substrate 1. A side surface electrode 3c for connecting the front surface electrode 3a with the back surface electrode 3b is formed on the surface of the cutout part 1a on one edge side. A side surface electrode 2c for connecting the front surface electrode 2a with the back surface electrode 2b is formed on the surface of the cutout part 1a on the other edge side.

The light emitting element 4 includes an n-side element electrode and a p-side element electrode formed on the bottom surface and the upper surface thereof respectively. The element electrode on the bottom surface side of the light emitting element 4 is adhered to the front surface electrode 2a of the insulated substrate 1 using silver paste 4a. The element electrode on the upper surface side of the light emitting element 4 is connected to the front surface electrode 3a of the insulated substrate 1 using a bonding wire 5.

The surface electrodes 2a and 3a are formed on the front surface of the insulated substrate 1 in such a manner to cover the cutout part 1a, and the back surface electrodes 2b and 3b are also formed on the back surface of the insulated substrate 1 in such a manner to cover the cutout part 1a. A resin 7 is filled in a region in between the front surface electrode 2a and the back surface electrode 2b of the cutout part 1a, and the resin 7 is also filled in a region in between the front surface electrode 3a and the back surface electrode 3b of the cutout part 1a.

In the chip-type LED 50 with such a structure, each of the upper part sides of the cutout parts 1a formed on the side surfaces of the insulated substrate 1 is covered with the front surface electrode 2a or 3a, so that an encapsulating resin 6 will not get into the region of the cutout part 1a.

Further, by the filling of the resin 7 into the cutout part 1a, the front surface electrode 3a is reinforced by the resin 7. Owing to this, the front surface electrode 3a will not be deformed even if the bonding wire 5 is bonded in the region above the cutout part 1a of the front surface electrode 3a.

In the chip-type LED 50 as disclosed in Reference 1, both of the substrate electrode 3, connected with an element electrode of one of the polarities of the light emitting element 4, and the substrate electrode 2, connected to an element electrode of the other one of the polarities of the light emitting element 4, have a structure in which the front surface electrode and the back surface electrode are electrically connected with each other through a side surface electrode formed in the cutout part 1a on the side surface of the insulated substrate 1. Therefore, there is a problem of disconnection or bad connection occurring at a connection part between the side surface electrode formed in the cutout part 1a and the front surface electrode or back surface electrode, due to deterioration over time, thus causing the malfunction, or deterioration in the characteristics, of the LED 50.

Thus, among chip-type LEDs, such LEDs have been developed where electrodes of respective polarities formed on an insulated substrate are structured to have a plurality of side surface electrodes in cutout parts 1a for connecting front surface electrodes and back surface electrodes.

FIG. 8 is a perspective view describing an improved conventional chip-type LED. FIG. 9 is a plan view describing an improved conventional chip-type LED, illustrating the one cut out into a chip as a structure of a back surface electrode of the chip-type LED (FIG. 9(a)) and the one before being cut out into a chip (FIG. 9(b)).

A chip-type LED (light emitting apparatus) 200 includes a light emitting element Ed, which is implemented on a ceramic substrate 201 in a shape of a rectangle in a plan view, and which is encapsulated with resin (not shown). A cathode electrode (not shown) of the light emitting element is connected to a front surface side cathode electrode 203 of the ceramic substrate 201 with a bonding wire W, and an anode electrode (now shown) of the light emitting electrode is connected to a front surface side anode electrode 204 of the ceramic substrate 201 with a bonding wire W.

The front surface side cathode electrode 203 is connected to a cathode electrode 205 on aback surface side of the ceramic substrate 201 via two side surface electrodes 205a and 205b, the side surface electrodes 205a and 205b being formed on the front surface of cutout parts (a part A in FIG. 8) having a generally semicircular shape in a plan view on a side surface of the ceramic substrate 201. Similarly, the front surface side anode electrode 204 is connected to an anode electrode 206 on the back surface side of the ceramic substrate 201 via two side surface electrodes 206a and 206b, the side surface electrodes 206a and 206b being formed on the front surface of cutout parts having a generally semicircular shape in a plan view on a side surface of the ceramic substrate 201.

FIG. 9(b) is a diagram illustrating a state where a chip-type LED (light emitting apparatus) 200 is formed in each of chip regions Rc of one base substrate, and where the base substrate is viewed from the back surface side thereof.

Scribe grooves SLv in a longitudinal direction and scribe grooves SLh in a transverse direction are formed on the back surface of a base substrate B, and a region (chip region) Rc surrounded by the scribe grooves includes a structure formed therein, which will be cut out as a light emitting apparatus 200.

In the chip region Rc, the cathode electrode 205 and the anode electrode 206 are formed along the scribe grooves SLh in a transverse direction. Two through holes TH are formed in the scribe groove SLh between a pair of chip regions Rc adjacent to each other in the longitudinal direction, and a conductor layer is formed on an internal surface of the through hole TH, which will be a side surface electrode of the ceramic substrate when being cut out into a chip. In addition, the upper part of the through hole TH is buried with an insulation member, such as a glass layer, or a dry film, in order to prevent encapsulating resin (not shown) from entering the through hole TH.

Similarly to the back surface side, another cathode electrode 203 and another anode electrode 204 are formed in each chip region on the front surface side of one base substrate.

In the chip-type LED 200 with such an improved structure, the front surface electrode and the back surface electrode of the insulated substrate are connected with each other through the side surface electrodes 205a and 205b or side surface electrodes 206a and 206b inside the two cutout parts formed in the insulated substrate. Thus, even if a bad connection, for example, occurs between the side surface electrode inside one cutout part and the front surface electrode or back surface electrode of the insulated substrate, the front surface electrode and the back surface electrode of the insulated substrate are electrically connected with each other through the side surface electrode of the other cutout part. As a result, a bad electrical connection will not occur between the front surface electrode and the back surface electrode, which makes it possible to prevent a back connection from occurring due to deterioration over time.

Next, a method for forming an electrode in an insulated substrate of such a chip-type ED 200 will be briefly described.

FIG. 10 is a diagram describing a forming process of an electrode of an improved conventional chip-type LED.

First, a printed conductor layer is formed as a front surface electrode 203, on a front surface of a ceramic substrate 201 in which through holes TH are formed (FIG. 10(a)). Next, a printed conductor layer is formed as a side surface electrode 205a on an internal surface of the through hole TH in such a manner to be connected with the front surface electrode (FIG. 10(b)). Subsequently, a printed conductor layer is formed as a back surface electrode 205 on a back surface of the insulated substrate 201 in such a manner to be connected with the side surface electrode (FIG. 10(c)). Subsequently, the ceramic substrate 201 is baked to solidify the ceramic substrate 201 (FIG. 10(d)). After the baking of the ceramic substrate 201, an insulation layer (not shown), such as a glass layer or a dry film, is formed in such a manner to cover the upper part of the through hole TH.

Reference 1: Japanese Laid-Open Publication No. 2001-177159

SUMMARY OF THE INVENTION

In the improved conventional chip-type LED 200 as described above, the front surface electrode and the back surface electrode of the insulated substrate are connected with each other through the side surface electrodes inside the two cutout parts formed in the insulated substrate. Thus, there is such a problem as follows: even if there is a bad connection occurring between the side surface electrode within one of the cutout parts and the front surface electrode or back surface electrode of the insulated substrate, and if the front surface electrode and the back surface electrode of the insulated substrate are electrically connected with each other through the side surface electrode of the other cutout part, it is not possible to detect the bad connection occurring in one of the side surface electrodes, resulting in deterioration over time and breakdown in the end.

For example, chip-type LEDs as described above are used as white-color back light LEDs of liquid crystal televisions. In such LEDs, deterioration over time has been occurring, which is thought to be due to the disconnection of the printed conductor layers formed within the through holes of the ceramic substrate.

Further, as illustrated in FIG. 8, the upper part of the cutout part (semicircular through hole part) of the side surface of the insulated substrate is buried with a glass layer 209 so that encapsulating resin will not come out. Thus, it is not possible to detect disconnection of the printed conductor within the through hole by visual inspection.

In addition, while a plurality of sets of LED wiring patterns (wiring patterns of an electrode corresponding to one chip-type LED) are formed simultaneously, the wiring patterns are formed as plated electrodes by electrolytic plating. Thus, all of the wiring patterns are electrically connected with one another, and continuity inspection cannot be performed for each of individual semicircular through holes after the electrodes of the LED substrate are formed.

In addition, although the chip-type LEDs are separated from one another as individual LED packages in the end, there is a possibility of a through hole penetrating electrode (side surface electrode after the separation) peeling off from the back surface side of the substrate during the separation.

In addition, although continuity inspection can be performed immediately after the forming of the printed conductor before plating, there is a possibility of bad continuity between the side surface electrode and the front surface and back surface electrode due to expansion and contraction of the substrate by thermal expansion at the subsequent forming of the glass layer or at the cutting step. Thus, another inspection is required for the final products (LED packages).

However, as described above, the front surface electrode and the back surface electrode of the insulated substrate are connected with each other through the two through hole penetrating electrodes, which are formed in the insulated substrate, in the improved chip-type LED 200. Thus, even if a bad connection occurred between one of the through hole penetrating electrodes and the front surface electrode or back surface electrode of the insulated substrate, the front surface electrode and the back surface electrode of the insulated substrate would be electrically connected with each other through the other one of the through hole penetrating electrodes. This makes it impossible to detect a bad connection occurring in one of the through hole penetrating electrodes, which causes a problem of not being able to provide LED devices of high reliability, in which the front surface electrodes and the back surface electrodes of the insulated substrate are favorably connected with one another through the two through hole penetrating electrodes formed in the insulated substrate, and which experience minimal deterioration over time.

The present invention is intended to solve the conventional problems described above. The electrode structure of an insulated substrate constituting a front surface implementing type device, in which a semiconductor chip is implemented on the insulated substrate, is formed to have an electrode structure of high reliability, in which the front surface electrode and the back surface electrode thereof are connected with each another through a plurality of connection electrodes. Further, in such an electrode structure, inspection for a bad connection can be reliably performed between the front surface electrode or back surface electrode and any of the plurality of connection electrodes. As a result, it is an objective of the present invention to provide a semiconductor apparatus and an inspect ion method thereof, capable of providing LED devices or IC parts of high reliability and with minimal deterioration over time, as well as an electric device using such a semiconductor apparatus.

A semiconductor apparatus according to the present invention, with a semiconductor element implemented on an insulated substrate, comprises: a substrate front surface electrode formed on a front surface side of the insulated substrate and connected with an element electrode of the semiconductor element; a substrate back surface electrode formed on a back surface side of the insulated substrate and electrically connected with the substrate front surface electrode; and a plurality of connection electrodes, extending in a thickness direction of the insulated substrate from one side to the other side of a front surface and a back surface thereof, for electrically connecting the substrate front surface electrode with the substrate back surface electrode, where the substrate front surface electrode or the substrate back surface electrode is formed to have a plane pattern separated for each of the plurality of connection electrodes, thereby achieving the objective described above.

Preferably, in a semiconductor apparatus according to the present invention, the substrate front surface electrode is formed to have a continuous single plane pattern, which is electrically connected with all of the plurality of connection electrodes; and the substrate back surface electrode is formed to have a plane pattern separated for each of the plurality of connection electrodes.

Still preferably, in a semiconductor apparatus according to the present invention, the substrate front surface electrode is formed to have a plane pattern separated for each of the plurality of connection electrodes; and the substrate back surface electrode is formed to have a continuous single plane pattern, which is electrically connected with all of the plurality of connection electrodes.

Still preferably, in a semiconductor apparatus according to the present invention, the semiconductor apparatus comprises encapsulating resin for encapsulating the semiconductor element arranged on the insulated substrate; a cutout part is formed in a side surface of the insulated substrate, extending from one side to the other side of the front surface and the back surface of the insulated substrate; and the plurality of connection electrodes are a plurality of side surface electrodes which formed on a front surface of the cutout part, for electrically connecting the substrate front surface electrode with the substrate back surface electrode.

Still preferably, in a semiconductor apparatus according to the present invention, a connection part between the side surface electrode and the substrate front surface electrode is covered with an insulation film, the insulation film being formed to prevent the encapsulating resin from entering the cutout part in which the side surface electrode is formed.

Still preferably, in a semiconductor apparatus according to the present invention, the semiconductor apparatus has a through hole formed in the insulated substrate, extending from one side to the other side of the front surface and the back surface of the insulated substrate; and the connection electrodes are a plurality of connection electrodes each formed on an internal surface of the through hole, for electrically connecting the substrate front surface electrode with the substrate back surface electrode.

Still preferably, in a semiconductor apparatus according to the present invention, the substrate front surface electrode comprises: a first substrate front surface electrode formed on the front surface side of the insulated substrate and connected with a first element electrode of the semiconductor element; and a second substrate front surface electrode formed on the front surface side of the insulated substrate and connected with a second element electrode of the semiconductor element; where the substrate back surface electrode comprises: a first substrate back surface electrode formed on the back surface side of the insulated substrate and electrically connected with the first substrate front surface electrode; and a second substrate back surface electrode formed on the back surface side of the insulated substrate and electrically connected with the second substrate front surface electrode; where the side surface electrode comprises: a plurality of first side surface electrodes extending in the thickness direction of the insulated substrate from one side to the other side of the front surface and the back surface of the insulated substrate, for electrically connecting the first substrate front surface electrode and the first substrate back surface electrode; and a plurality of second side surface electrodes extending in the thickness direction of the insulated substrate from one side to the other side of the front surface and the back surface of the insulated substrate, for electrically connecting the second substrate front surface electrode and the second substrate back surface electrode; where the first substrate back surface electrode is formed to have a plane pattern separated for each of the plurality of first side surface electrodes, and where the second substrate back surface electrode is formed to have a plane pattern separated for each of the plurality of second side surface electrodes.

Still preferably, in a semiconductor apparatus according to the present invention, the semiconductor element is a light emitting diode having a cathode electrode as the first element electrode, and having an anode electrode as the second element electrode; the cathode electrode as the first element electrode is connected with the first substrate front surface electrode; and the anode electrode as the second element electrode is connected with the second substrate front surface electrode.

Still preferably, in a semiconductor apparatus according to the present invention, the first substrate front surface electrode connected with the cathode electrode is connected with the first substrate back surface electrode with two of the first side surface electrodes interposed therebetween; and the second substrate front surface electrode connected with the anode electrode is connected with the second substrate back surface electrode with two of the second side surface electrodes interposed therebetween.

Still preferably, in a semiconductor apparatus according to the present invention, the substrate front surface electrode and the substrate back surface electrode are arranged in such a manner not to overlap a scribe line for scribing the insulated substrate, the scribe line being established on the insulated substrate.

Still preferably, in a semiconductor apparatus according to the present invention, the semiconductor apparatus has an encapsulating body formed above the insulated substrate in such a manner to cover the semiconductor element, for encapsulating the semiconductor element; and the substrate front surface electrode is formed in such a manner to reach outside of the encapsulating body from the inside thereof.

Still preferably, in a semiconductor apparatus according to the present invention, the insulated substrate is a ceramic substrate.

A method for inspecting the semiconductor apparatus according to the present invention comprises: a step of applying voltage in between parts corresponding to two separated plane patterns of the substrate front surface electrode when the substrate front surface electrode has a plane pattern separated for each of the plurality of connection electrodes, and applying voltage in between parts corresponding to two separated plane patterns of the substrate back surface electrode when the substrate back surface electrode has a plane pattern separated for each of the plurality of connection electrodes; and a step of confirming a continuity state between the plurality of connection electrodes, and the substrate front surface electrode and the substrate back surface electrode, based on a current value generated at the step of applying voltage, thereby achieving the objective described above.

An electric device according to the present invention comprises a semiconductor apparatus, where the semiconductor apparatus is a semiconductor apparatuses according to any of the present invention.

The functions of the present invention will be described hereinafter.

In the present invention, a semiconductor apparatus with a semiconductor element implemented on an insulated substrate, comprises: a substrate front surface electrode formed on a front surface side of the insulated substrate; a substrate back surface electrode formed on aback surface side of the insulated substrate; and a plurality of connection electrodes formed to extend in a thickness direction of the insulated substrate, for electrically connecting the substrate front surface electrode with the substrate back surface electrode, so that the electrode structure of the insulated substrate can be a highly reliable one in which the substrate front surface electrode and the substrate back surface electrode are connected with each other through the plurality of connection electrodes.

Furthermore, the substrate front surface electrode or the substrate back surface electrode is formed to have a plane pattern separated for each of the plurality of connection electrodes. Accordingly, the application of test voltage in between portions having a separated plane pattern of the substrate front surface electrode or substrate back surface electrode makes it possible to reliably inspect a bad connection between the substrate front surface electrode or substrate back surface electrode and any of the plurality of connection electrodes.

Furthermore, in the present invention, side surface electrodes, which are the connection electrodes described above, are formed in cutout parts formed in the side surface of the insulated substrate in the substrate thickness direction. Furthermore, the cutout part is covered with an insulation film to prevent the encapsulating resin from entering the cutout part in which the side surface electrode is formed. As a result, avulsion or disconnection can be prevented between the side surface electrode and the back surface electrode due to the entering of the resin into the cutout part.

Furthermore, in the encapsulating structure, the connection part between the side surface electrode and the substrate front surface electrode is covered with an insulation film, the insulation film formed to prevent the encapsulating resin from entering the cutout part in which the side surface electrode is formed. Thus, although visual inspection is not possible at the connection part, any disconnection or bad connection at the connection part between the side surface electrode and the substrate front surface electrode can be reliably detected by the application of the test signal described above.

According to the present invention as described above, the electrode structure of the insulated substrate, which constitutes the front surface implementing type device, in which a semiconductor chip is implemented on the insulated substrate, is formed to have an electrode structure of high reliability, in which the front surface electrode and the back surface electrode thereof are connected with each other through a plurality of connection electrodes. Further, in such an electrode structure, inspection for a bad connection can be reliably performed between the front surface electrode or back surface electrode and any of the plurality of connection electrodes. As a result, the present invention has an effect of providing an LED device or an IC part with minimal deterioration over time and high reliability.

These and other advantages of the present invention will become apparent to those skilled in the art upon reading and understanding the following detailed description with reference to the accompanying figures.

BRIEF DESCRIPTION OF THE DRAWINGS

FIG. 1(a) is a perspective view illustrating an overall structure thereof. FIG. 1(b) is a partial cross sectional view illustrating a part A in FIG. 1(a). FIG. 1(c) is a plan view corresponding to FIG. 1(b).

FIG. 2(a) illustrates a plane pattern of a back surface electrode of the semiconductor apparatus according to Embodiment 1. FIG. 2(b) illustrates a plane pattern of a back surface electrode of the semiconductor apparatus according to Embodiment 2. FIGS. 2(c) and 2(d) illustrate a plane pattern of a back surface electrode of the semiconductor apparatus according to Variation Example of Embodiment 2.

FIG. 4(a) is a plan view thereof. FIG. 4(b) is a bottom plan view thereof. FIG. 4(c) is a side view thereof.

FIG. 5(a) is a plan view thereof. FIG. 5(b) is a bottom plan view thereof. FIG. 5(c) is a side view thereof.

FIG. 6(a) is a plan view thereof. FIG. 6(b) is a bottom plan view thereof. FIG. 6(c) is a side view thereof.

Figure 1:
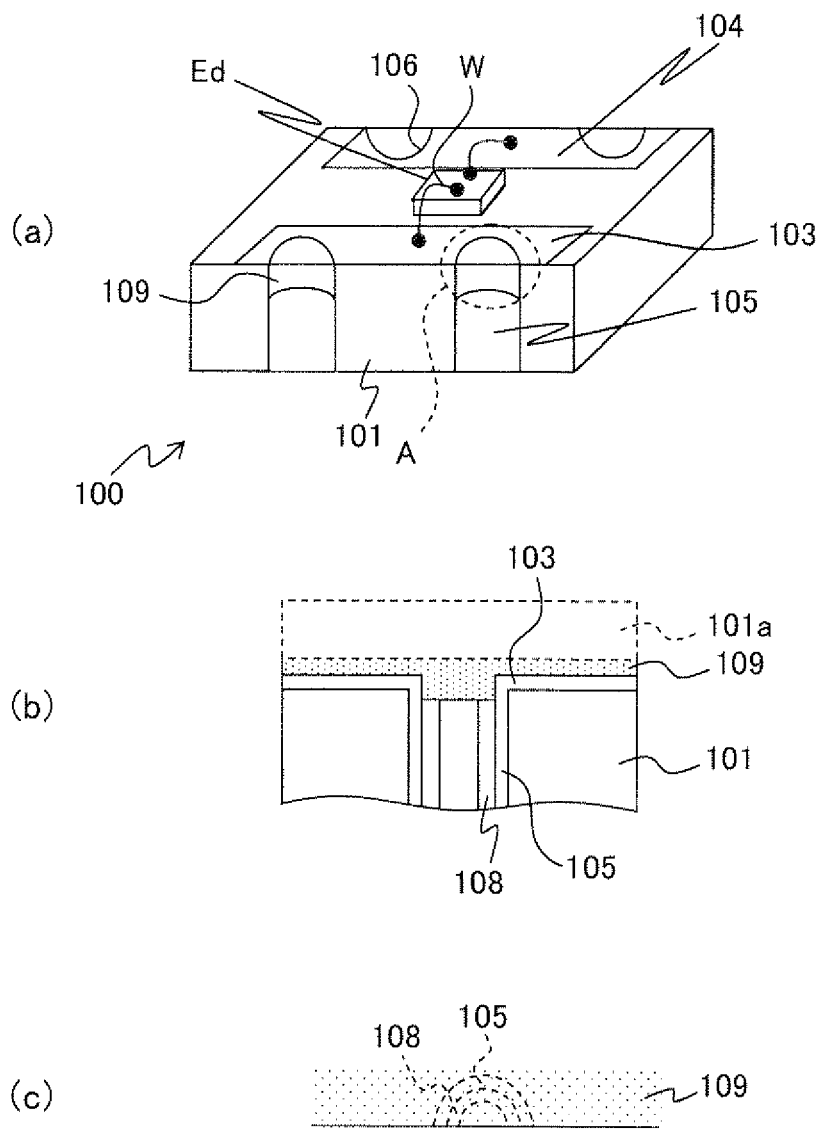
FIG. 1 is a diagram describing a semiconductor apparatus (a semiconductor light emitting apparatus) according to Embodiment 1 of the present invention.

10, 20, 30, 100, 110, 120, 130 semiconductor light emitting apparatus
15a, 15b, 25a, 25b, 35a, 35b back surface individual cathode electrode
15c, 16c, 35c, 36c cutout part
16a, 16b, 26a, 26b, 36a, 36b back surface individual anode electrode
101, 111, 121, 131 ceramic substrate
101a, 121a, 131a encapsulating resin
103, 113, 135, 230, 330 front surface cathode electrode
104, 114, 136, 240, 340 front surface anode electrode
105, 106 side surface electrode
105a, 105b back surface individual cathode electrode
106a, 106b back surface individual anode electrode
108 plating layer
115, 116, 123, 124, 133 through hole penetrating conductor
115a, 115b back surface individual cathode electrode
116a, 116b back surface individual anode electrode
123a, 133a front surface cathode electrode main body section
123b, 133b front surface cathode electrode separation section
124a, 134a front surface anode electrode main body section
124b, 134b front surface anode electrode separation section
125, 150 back surface cathode electrode
126, 160 back surface anode electrode
127 reflector member
B base substrate
Rc chip region
SLh scribe groove in a transverse direction
SLv scribe groove in a longitudinal direction
TH through hole
W bonding wire

DESCRIPTION OF THE PREFERRED EMBODIMENTS

Hereinafter, embodiments of the present invention will be described with reference to the accompanying figures.

Embodiment 1

Figure 2:
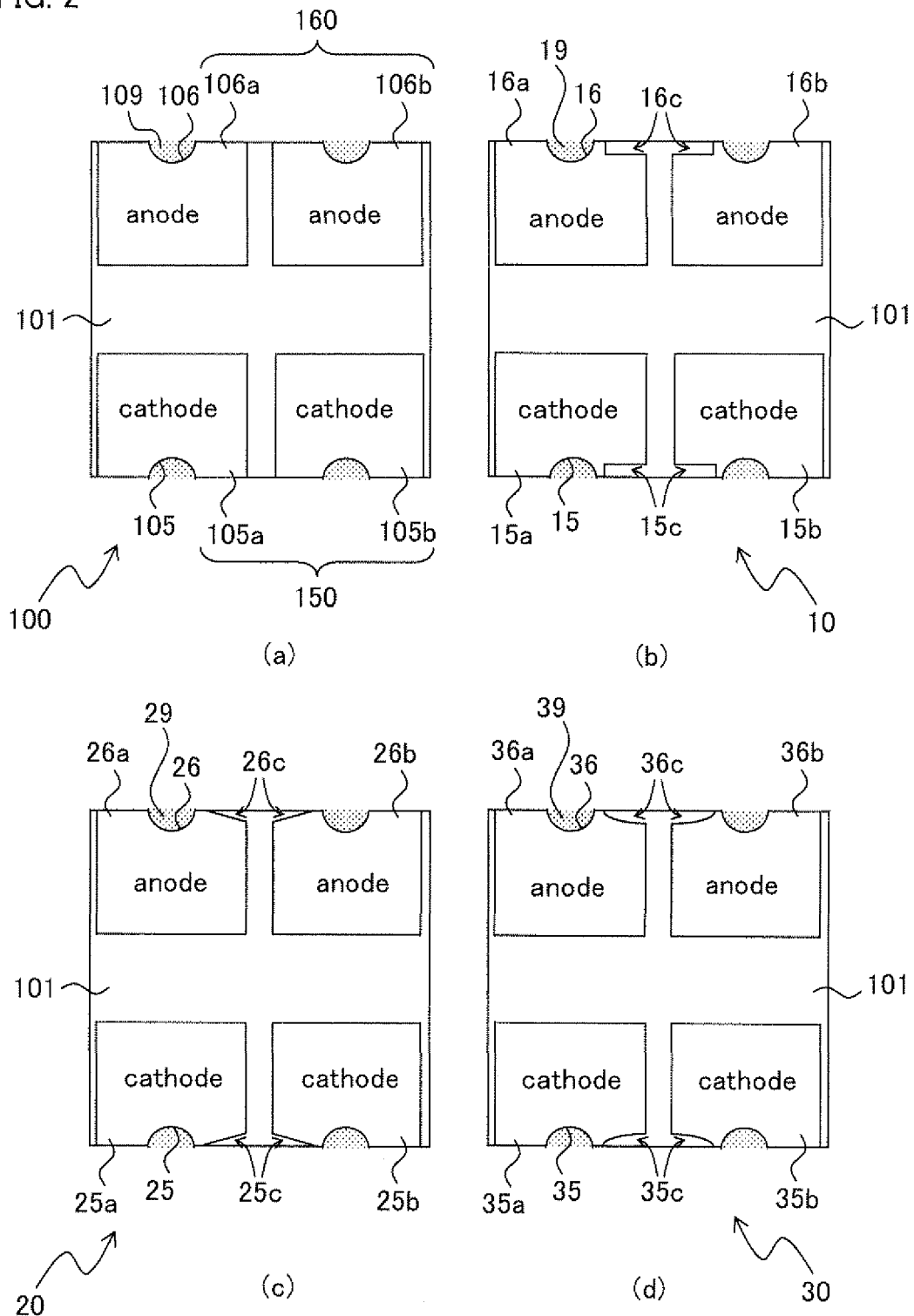
FIG. 2 is a diagram describing a back surface element of a semiconductor apparatus (a semiconductor light emitting apparatus) according to Embodiments 1 and 2 of the present invention.

FIGS. 1 and 2 are each diagrams describing a semiconductor apparatus according to Embodiment 1 of the present invention. FIG. 1(a) is a perspective view illustrating an overall structure thereof. FIG. 1(b) is a partial cross sectional view illustrating a part A in FIG. 1(a). FIG. 1(c) is a plan view corresponding to FIG. 1(b). In addition, FIG. 2(a) illustrates a plane pattern of a back surface electrode of the semiconductor apparatus according to Embodiment 1.

A semiconductor apparatus 100 according to Embodiment 1 is a semiconductor light emitting apparatus in which a light emitting element Ed is implemented as a semiconductor element on an insulated substrate 101 such as a ceramic substrate.

The semiconductor apparatus 100 is obtained by implementing the light emitting element (light emitting diode) Ed on the insulated substrate 101, such as a ceramic substrate, in the shape of a rectangle in a plan view, and encapsulating the light emitting element (light emitting diode) Ed with a resin 101a. In the semiconductor apparatus 100, a cathode electrode (not shown) of the light emitting element Ed is connected with a front surface cathode electrode 103 with a bonding wire W, and an anode electrode of the light emitting element Ed is connected with a front surface anode electrode 104 with a bonding wire W. The front surface cathode electrode 103 is formed on the front surface of the ceramic substrate 101, and the front surface anode electrode 104 is also formed on the front surface of the ceramic substrate 101.

The front surface cathode electrode 103 is connected with back surface individual cathode electrodes 105a and 105b, which are formed on the back surface of the ceramic substrate 101, through two side surface electrodes 105 formed on front surfaces of cutout parts, which are generally semicircular in a plan view, on one side surface of the ceramic substrate 101.

Similarly, the front surface anode electrode 104 is connected with back surface individual anode electrodes 106a and 106b, which are formed on the back surface of the ceramic substrate 101, through two side surface electrodes 106 formed on front surfaces of cutout parts, which are generally semicircular in a plan view, on the other side surface of the ceramic substrate 101.

The back surface individual cathode electrodes 105a and 105b configure one substrate back surface electrode (back surface cathode electrode) 150 of a first polarity, and each of the back surface cathode electrodes 105a and 105b is a portion having a plane pattern separated for each side surface electrode of the one back surface cathode electrode 150. The back surface individual anode electrodes 106a and 106b constitute one substrate back surface electrode (back surface anode electrode) 160 of a second polarity, and each of the back surface anode electrodes 106a and 106b is a portion having a plane pattern separated for each side surface electrode of the one back surface anode electrode 160.

In addition, a glass layer 109 is formed on the front surface cathode electrode 103 of the ceramic substrate 101, in such a manner to bury the upper part of the cutout part. An encapsulating resin 101a is formed on the glass layer 109. Further, a plating layer 108 is formed on the front surface of the side surface electrode 105 within the cutout part.

The insulated substrate 101 of the semiconductor apparatus 100 according to Embodiment 1 is in a square shape with an edge of about 3 mm, and the thickness of the insulated substrate 101 is about 600 µm. Further, the width of the belt-shaped front surface cathode electrode 103 and the belt-shaped front surface anode electrode 104 is 1 mm, and the length thereof is 2.6 mm, which is a little shorter than the length of the edge of the insulated substrate 101.

The pair of separated back surface individual cathode electrodes 105a and 105b constitutes the back surface cathode electrode 150, and each of them has a shape of a rectangle in a plan view. The back surface individual cathode electrodes 105a and 105b are arranged with a space of 0.3 mm in between them. The long side of the rectangle is 1.15 mm, and short side thereof is 1 mm.

The pair of separated back surface individual anode electrodes 106a and 106b constitutes the back surface anode electrode 160, and each of them has a shape of a rectangle in a plan view. The back surface individual anode electrodes 106a and 106b are arranged with a space of 0.3 mm in between them. The long side of the rectangle is 1.15 mm, and short side thereof is 1 mm.

In addition, there is a space of 1 mm separating the back surface individual cathode electrodes 105a and 105b constituting the back surface cathode electrode 150 from the back surface individual anode electrodes 106a and 106b constituting the back surface anode electrode 160.

Figure 3:
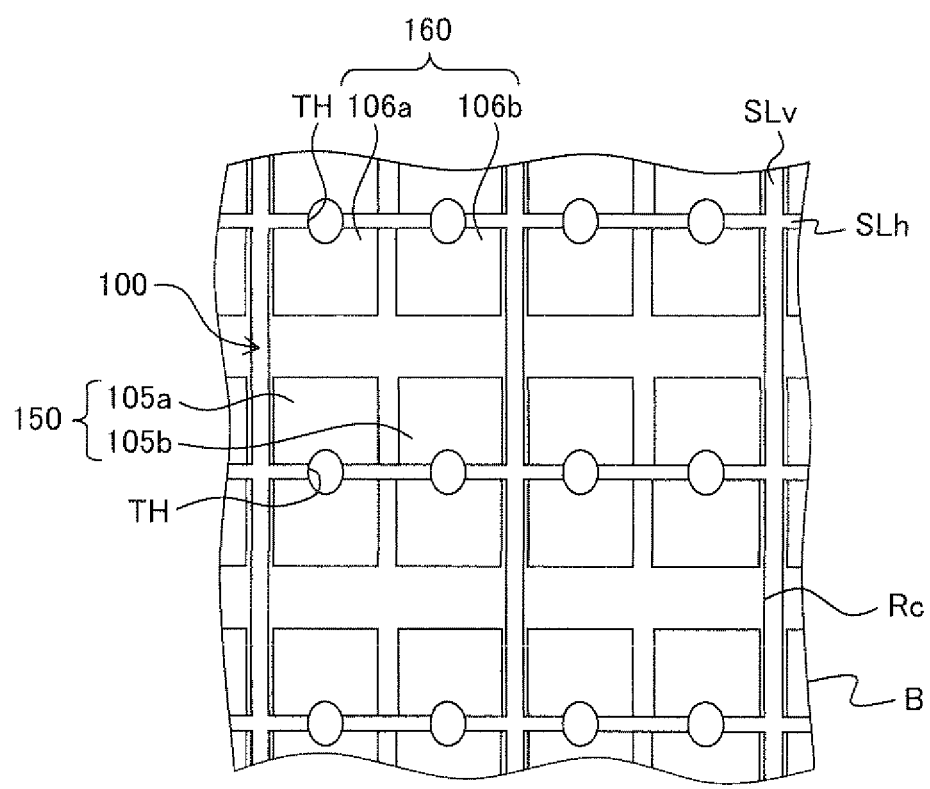
FIG. 3 is a diagram describing a semiconductor light emitting apparatus according to Embodiment 1 of the present invention, illustrating a state where a chip-type LED (semiconductor light emitting apparatus) is formed in each of chip regions of one base substrate, and further illustrating a structure on the back surface side of the base substrate.

Further, FIG. 3 is a diagram describing a semiconductor light emitting apparatus according to Embodiment 1 of the present invention, illustrating a state where a chip-type LED (semiconductor light emitting apparatus) 100 is formed in each of chip regions of one base substrate, and further illustrating a structure on the back surface side of the base substrate.

Scribe grooves SLv in a longitudinal direction and scribe grooves SLh in a transverse direction are formed on the back surface of a base substrate B, and a structure, which is to be cut out as one light emitting apparatus 100, is formed in a region (chip region) Rc surrounded by the scribe grooves. The width of the scribe grooves is about 20 μm to 50 μm.

In the chip region Rc, the back surface cathode electrode 150 and the back surface anode electrode 160 are formed along the scribe groove SLh in a transverse direction. Two through holes TH of a diameter of about 300 μm are formed in a scribe groove SL in between a pair of chip regions Rc adjacent to each other in a longitudinal direction. A conductor layer is formed in an internal surface of the through hole TH. The conductor layer becomes a side surface electrode of a ceramic substrate (chip substrate) after the chip region is cut out. The upper part of the through hole TH is buried with an insulated layer, such as a glass layer 109, in order to prevent the encapsulating region 101a from entering the through hole TH.

The back surface cathode electrode 150 is constituted of the back surface individual cathode electrodes 105a and 105b, which have a plane pattern separated for each of two side surface electrodes 105. The back surface anode electrode 160 is constituted of the back surface individual anode electrodes 106a and 106b, which have a plane pattern separated for each of two side surface electrodes 106.

When the semiconductor light emitting apparatus 100 with such a structure is mounted on a mounted substrate such as a printed board, the back surface individual cathode electrodes 105a and 105b in the semiconductor light emitting apparatus 100 are electrically connected with each other through the conductor layer of the mounted substrate, and the back surface individual anode electrodes 106a and 106b in the semiconductor light emitting apparatus 100 are electrically connected with each other through the conductor layer of the mounted substrate.

Next, working effects of the present invention will be described.

A method for inspecting a bad connection in such a semiconductor light emitting apparatus 100 according to Embodiment 1 will be briefly described.

Since the front surface side of the semiconductor light emitting apparatus 100 is covered with the encapsulating resin 101a, an inspection electrode cannot be allowed to be in contact therewith. However, the back surface cathode electrode 150 and back surface anode electrode 160, for connecting with a conductor layer of a mounted substrate, such as a printed board, are exposed on the back surface side of the semiconductor light emitting apparatus 100. Moreover, the back surface cathode electrode 150 is separated for each side surface electrode 105 formed within the cutout part of the insulated substrate 101. Thus, the application of test voltage in between the separated back surface individual cathode electrodes 105a and 105b forms a current path from the back surface individual cathode electrode, which is one of the back surface individual cathode electrodes, of the insulated substrate 101 to the side surface electrode 105 connected therewith, and further to the front surface cathode electrode 103, the side surface electrode 105 connected to this front surface cathode electrode 103, and to the other back surface individual cathode electrode 105b. Based on the value of the current flowing through the current path, a disconnection or a bad connection in the current path can be detected.

Similarly, the back surface anode electrode 160 is also separated for each side surface electrode 106 formed within the cutout part of the insulated substrate 101. Thus, the application of test voltage in between the separated back surface individual anode electrodes 106a and 106b forms a current path from the back surface individual anode electrode 106a, which is one of the back surface individual anode electrodes, of the insulated substrate 101 to the side surface electrode 106 connected therewith, and further to the front surface anode electrode 104, the side surface electrode 106 connected to this front surface anode electrode 104, and to the other back surface individual cathode electrode 106b. Thereby, a disconnection in the current path can be detected.

In this case, if even one of the two side surface electrodes 105 for connecting the front surface cathode electrode 103 and the back surface cathode electrode 150 is disconnected, or if even one of the two side surface electrodes 106 for connecting the front surface anode electrode 104 and the back surface anode electrode 160 is disconnected, a defect of disconnection can be detected.

In other words, products currently experiencing deterioration over time are considered to be those in which one of the two side surface electrodes provided for each of an anode and a cathode in an initial state is disconnected, and the other one of the side surface electrodes is having malfunction. On the other hand, in the present invention, if even one of the two side surface electrodes provided for each of an anode and a cathode is disconnected, it can be detected. Therefore, the present invention makes it possible to eliminate almost all deterioration over time due to the disconnection of the side surface electrodes.

In the semiconductor light emitting apparatus 100 according to Embodiment 1 with such a structure, the substrate front surface electrodes 103 and 104 of the insulated substrate 101 are connected with the substrate back surface electrodes 150 and 160 thereof by the side surface electrodes 105 and 106 within the two cutout parts formed in the side surface of the insulated substrate 101. Thus, for example, makes it possible to suppress the lowering of the yield rate of products due to bad continuity between the side surface electrode within the cutout part and the substrate front surface electrode or substrate back surface electrode. For example, suppose the rate of confirming the occurrence of bad continuity is 50%, even if a bad connection occurs at a point between the side surface electrode and the back surface individual cathode electrode, the connection can be secured between another side surface electrode and the back surface individual cathode electrode. As a result, the continuity can be secured, and the products will not be defective ones.

Further, in Embodiment 1, the substrate back surface electrode (back surface cathode electrode) 150 and the substrate back surface electrode (back surface anode electrode) 160 are structured to be separated for each side surface electrodes 105 and 106 formed within the cutout part of the insulated substrate 101. Thus, the application of test voltage in between the separated back surface individual cathode electrodes 105a and 105b allows the detection of a bad connection between the front surface cathode electrode 103 and the back surface cathode electrode 150. Further, the application of test voltage in between the separated back surface individual anode electrodes 106a and 106b allows the detection of a bad connection between the front surface anode electrode 104 and the back surface anode electrode 160. As a result, the deterioration over time can be avoided, and a semiconductor light emitting apparatus with high reliability can be provided.

Further, in Embodiment 1, the semiconductor light emitting apparatus 100 is structured such that the side surface electrodes (connection electrodes) 105 and 106 are formed at the cutout parts formed in the side surface of the insulated substrate 101 in the substrate thickness direction, and the light emitting element (semiconductor element) Ed on the insulated substrate 101 is encapsulated by the resin 101a. Further, the part connecting the side surface electrodes 105 and 106 with the front surface cathode electrode 103 and front surface anode electrode 104 is covered by the insulation film 109 to prevent encapsulating resin from entering the cutout parts, in which the side surface electrode is formed. Therefore, it is possible to prevent a bad connection or disconnection between the side surface electrodes and the back surface cathode electrode 150 and back surface anode electrode 160, due to the entering of resin into the cutout parts. Further, the application of the test signal described above makes it possible to reliably detect the disconnection or bad connection, which is not possible to detect by visual inspection, at the part connecting the side surface electrodes 105 and 106 with the front surface cathode electrode 103 and front surface anode electrode 104, where the portion is covered by the insulation film 109 for preventing the encapsulating resin from entering.

In Embodiment 1, the case has been described where the substrate front surface electrode is formed in such a manner to have a continuous single plane pattern, which is electrically connected with all of two side surface electrodes, and the substrate back surface electrode is formed in such a manner to have a plane pattern, which is separated for each of two side surface electrodes. However, the substrate front surface electrode may be formed in such a manner to have a plane pattern, which is separated for each of the two side surface electrodes, and the substrate back surface electrode may be formed in such a manner to have a continuous single plane pattern, which is electrically connected with all of the two side surface electrodes.

In addition, the plan view shape of the two back surface individual cathode electrodes constituting the back surface cathode electrode and the plan view shape of the two back surface individual anode electrodes constituting the back surface anode electrode are not limited to the shape illustrated in Embodiment 1.

Embodiment 2

FIGS. 2(b) to 2(d) are each a diagram describing a semiconductor light emitting apparatus according to Embodiment 2, and a variation example thereof, of the present invention. FIG. 2(b) is a diagram describing a semiconductor light emitting apparatus according to Embodiment 2.

A semiconductor light emitting apparatus 10 according to Embodiment 2 is a modification of the plan view shape of the two back surface individual cathode electrodes constituting the back surface cathode electrode, and the plan view shape of the two back surface individual anode electrodes constituting the back surface anode electrode, in the semiconductor light emitting apparatus 100 according to Embodiment 1 as described above.

For example, in the semiconductor light emitting apparatus 10 according to Embodiment 2 illustrated in FIG. 2(b), a cutout part 15c of a transversely-long belt-shape may be formed at a portion along a side edge of a insulated substrate 101, where two back surface individual cathode electrodes 15a and 15b constituting a back surface cathode electrode are opposed with each other. Further, a cutout part 16c of a transversely-long belt-shape may be formed at a portion along a side edge of the insulated substrate 101, where two back surface individual anode electrodes 16a and 16b constituting a back surface anode electrode are opposed with each other. The width of the cutout parts 15c and 16c is 0.2 mm, and the length thereof is 0.3 mm. In FIG. 2(b), the reference numerals 15 and 16 each denote a side surface electrode formed at a cutout part in a side surface of the insulated substrate 101. The reference numeral 19 denotes an insulation layer formed on a front surface side of the cutout part.

In the semiconductor light emitting apparatus 10 with such a structure, a printed conductor for constituting a back surface electrode gets into a scribe groove, making it possible to suppress a short circuit of adjacent back surface individual cathode electrodes 15a and 15b, or adjacent back surface individual anode electrodes 16a and 16b.

It should be noted that the shape of the cutout part described above is not limited to the transversely-long belt-shape, as in the semiconductor light emitting apparatus 10 according to Embodiment 2.

Variation Example 1 of Embodiment 2

FIG. 2(c) is a diagram describing a semiconductor light emitting apparatus 20 according to Variation Example 1 of Embodiment 2.

In the semiconductor light emitting apparatus 20 according to Variation Example 1 of Embodiment 2 as illustrated in FIG. 2(c), the shape of the cutout part is a triangular wedge-shape.

Specifically, as illustrated in FIG. 2(c), a cutout part 25c of a triangular wedge-shape may be formed at a portion along a side edge of an insulated substrate 101, where two back surface individual cathode electrodes 25a and 25b constituting a back surface cathode electrode are opposed with each other. Further, a cutout part 26c of a triangular wedge-shape may be formed at a portion along a side edge of the insulated substrate 101, where two back surface individual anode electrodes 26a and 26b constituting aback surface anode electrode are opposed with each other. The size of the cutout parts 25c and 26c of a triangular wedge-shape is similar to the size of the belt-shaped cutout parts 15c and 16c in Embodiment 2. In FIG. 2(c), the reference numerals 25 and 26 each denote a side surface electrode formed at a cutout part in a side surface of the insulated substrate 101. The reference numeral 29 denotes an insulation layer formed on a front surface side of the cutout part.

In the semiconductor light emitting apparatus 20 according to Variation Example 1 of Embodiment 2 with such a structure, a similar effect as obtained from the semiconductor light emitting apparatus 10 according to Embodiment 2 can also be obtained.

Variation Example 2 of Embodiment 2

FIG. 2(d) is a diagram describing Variation Example 2 of Embodiment 2.

In a semiconductor light emitting apparatus 30 illustrated in FIG. 2(d), the side edge of the cutout part of the semiconductor light emitting apparatus 30 has a curved shape.

Specifically, as illustrated in FIG. 2(d), a cutout part 35c of a triangular wedge-shape with a curved hypotenuse is formed at a portion along a side edge of an insulated substrate 101, where two back surface individual cathode electrodes 35a and 35b constituting a back surface cathode electrode are opposed with each other. Further, a cutout part 36c of a triangular wedge-shape with a curved hypotenuse is formed at a portion along a side edge of the insulated substrate 101, where two back surface individual anode electrodes 36a and 36b constituting a back surface anode electrode are opposed with each other. The size of the cutout parts 35c and 36c is similar to the size of the belt-shaped cutout parts 15c and 16c described above. In FIG. 2(d), the reference numerals 35 and 36 each denote a side surface electrode formed at a cutout part in a side surface of the insulated substrate 101. The reference numeral 39 denotes an insulation layer formed on a front surface side of the cutout part.

In the semiconductor light emitting apparatus 30 according to Variation Example 2 of Embodiment 2 with such a structure, a similar effect as obtained from the semiconductor light emitting apparatus 10 according Embodiment 2 can also be obtained.

In Embodiments 1 and 2 as well as in Variation Examples 1 and 2 of Embodiment 2, as a structure of the substrate electrode in the semiconductor light emitting apparatus, an electrode structure has been described where the front surface side electrode and the back surface side electrode of the insulated substrate are connected with each other through the side surface electrode formed at the cutout part in the side surface of the insulated substrate. However, the front surface side electrode and the back surface side electrode of the insulated substrate may also be connected with each other through a penetrating electrode, which penetrates a through hole formed in the insulated substrate. Hereinafter, a semiconductor light emitting apparatus having such an electrode structure will be described as Embodiment 3 and Variation Examples 1 and 2 thereof.

Embodiment 3

Figure 4:
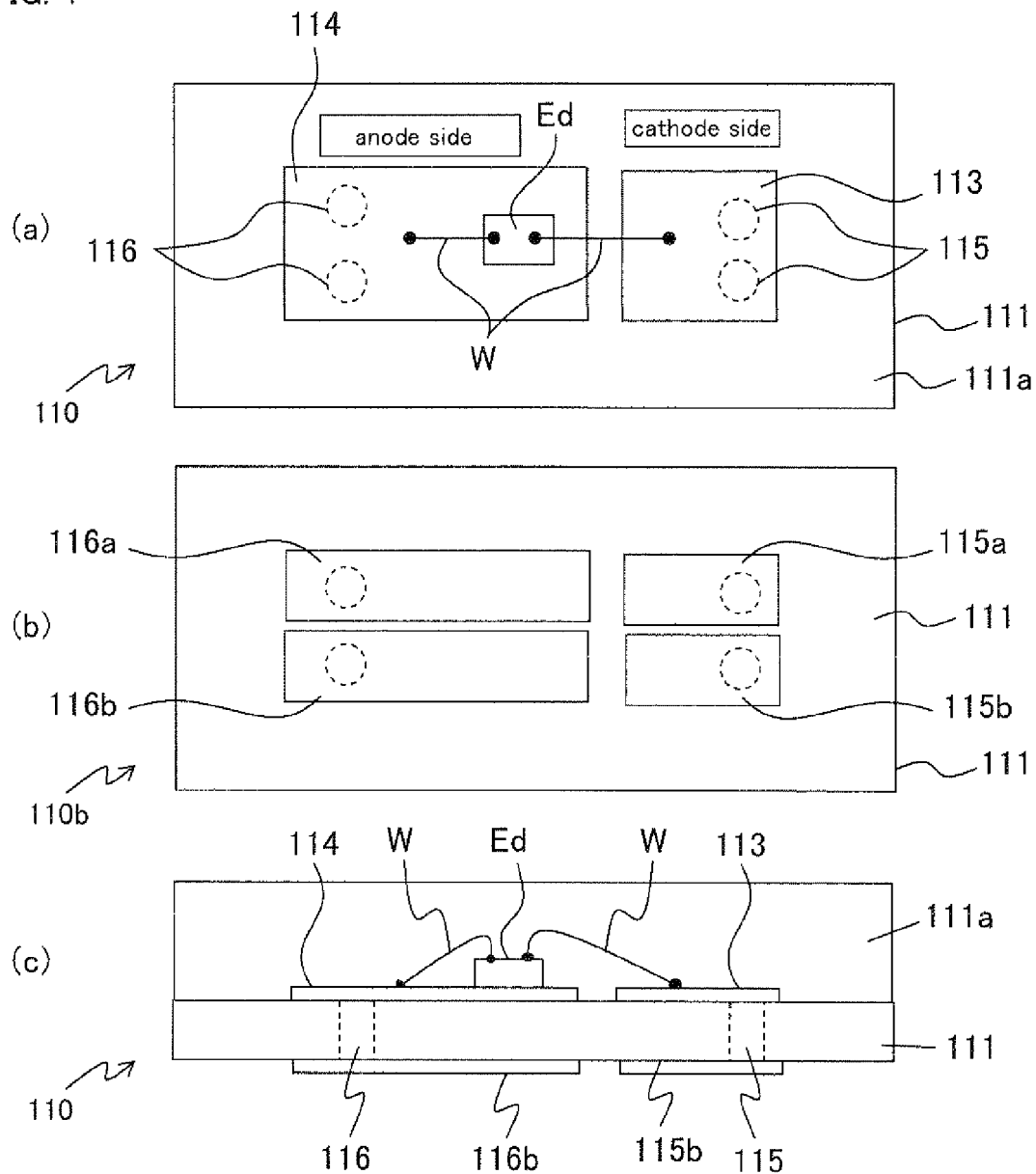
FIG. 4 is a diagram describing a semiconductor apparatus (semiconductor light emitting apparatus) according to Embodiment 3 of the present invention.

FIG. 4 is a diagram describing a semiconductor light emitting apparatus according to Embodiment 3 of the present invention. FIG. 4(a) is a plan view thereof. FIG. 4(b) is a bottom plan view thereof. FIG. 4(c) is a side view thereof.

Similarly to the semiconductor light emitting apparatus according to Embodiment 1 or 2, a semiconductor light emitting apparatus 110 according to Embodiment 3 is a semiconductor light emitting apparatus in which a light emitting element Ed is implemented as a semiconductor element on an insulated substrate 111, such as a ceramic substrate.

The semiconductor light emitting apparatus 110 has a ceramic substrate 111 of a shape of a rectangle in a plan view. The light emitting element (light emitting diode) Ed is implemented on the ceramic substrate 111, and is encapsulated with resin 111a. A front surface cathode electrode 113 and a front surface anode electrode 114 are formed in an opposing manner on the front surface of the ceramic substrate 111. The light emitting element (light emitting diode) Ed is adhered to the front surface anode electrode 114 with an insulated member interposed therebetween. In addition, a cathode electrode (not shown) of the light emitting element Ed is connected with a front surface cathode electrode 113 with a bonding wire W, and an anode electrode (not shown) of the light emitting element Ed is connected with a front surface anode electrode 114 with a bonding wire W.

On the back surface side of the ceramic substrate 111, two separated back surface individual cathode electrodes 115a and 115b are arranged in such a manner to oppose one front surface cathode electrode 113. The two back surface individual cathode electrodes 115a and 115b are each connected to the front surface cathode electrode 113 through penetrating conductors (hereinafter, referred to as through hole penetrating conductors) within separate through holes formed in the ceramic substrate 111.

Similarly, on the back surface side of the ceramic substrate 111, two separated back surface individual anode electrodes 116a and 116b are arranged in such a manner to oppose one front surface anode electrode 114. The two back surface individual anode electrodes 116a and 116b are each connected to the front surface anode electrode 114 through penetrating conductors (hereinafter, referred to as through hole penetrating conductors) 116 within separate through holes formed in the ceramic substrate 111.

In the semiconductor light emitting apparatus 110 according to Embodiment 3 with such a structure, the front surface cathode electrode 113 of the ceramic substrate, for example, is connected with the two through hole penetrating conductors 115, which are connected with the back surface individual cathode electrodes 115a and 115b. Therefore, it is possible to suppress the lowering of the yield rate of products because of a bad continuity due to a bad connection between, for example, the through hole penetrating conductor and the back surface individual cathode electrode. For example, suppose the rate of confirming the occurrence of bad continuity is 50%, even if a bad connection occurs at a point between the through hole penetrating conductor and the back surface individual cathode electrode, the connection can be secured between another through hole penetrating conductor and the back surface individual cathode electrode. As a result, the continuity can be secured, and the products will not be defective ones.

In addition, the connection conditions between the front surface anode electrode 114 and the back surface individual anode electrodes 116a and 116b can also be similarly highly reliable.

In addition, in Embodiment 3, the back surface cathode electrode and the back surface anode electrode are structured to be separated for each through hole penetrating conductor of the ceramic substrate. Therefore, the application of test voltage in between the separated back surface individual cathode electrodes 115a and 115b allows the detection of a bad connection between the front surface cathode electrode 113 and the back surface individual cathode electrodes 115a and 115b. Further, the application of test voltage in between the separated back surface individual anode electrodes 116a and 116b allows the detection of a bad connection between the front surface anode electrode 114 and the back surface individual anode electrodes 116a and 116b. As a result, the deterioration over time can be avoided, and a semiconductor light emitting apparatus with high reliability can be provided.

In Embodiment 3, the semiconductor light emitting apparatus has been described with a structure where the back surface side electrodes of the ceramic substrate 111 are separated. However, the semiconductor light emitting apparatus may have a structure where the cathode electrode and the anode electrode on the front surface side of the ceramic substrate 111 are separated.

Variation Example 1 of Embodiment 3

Figure 5:
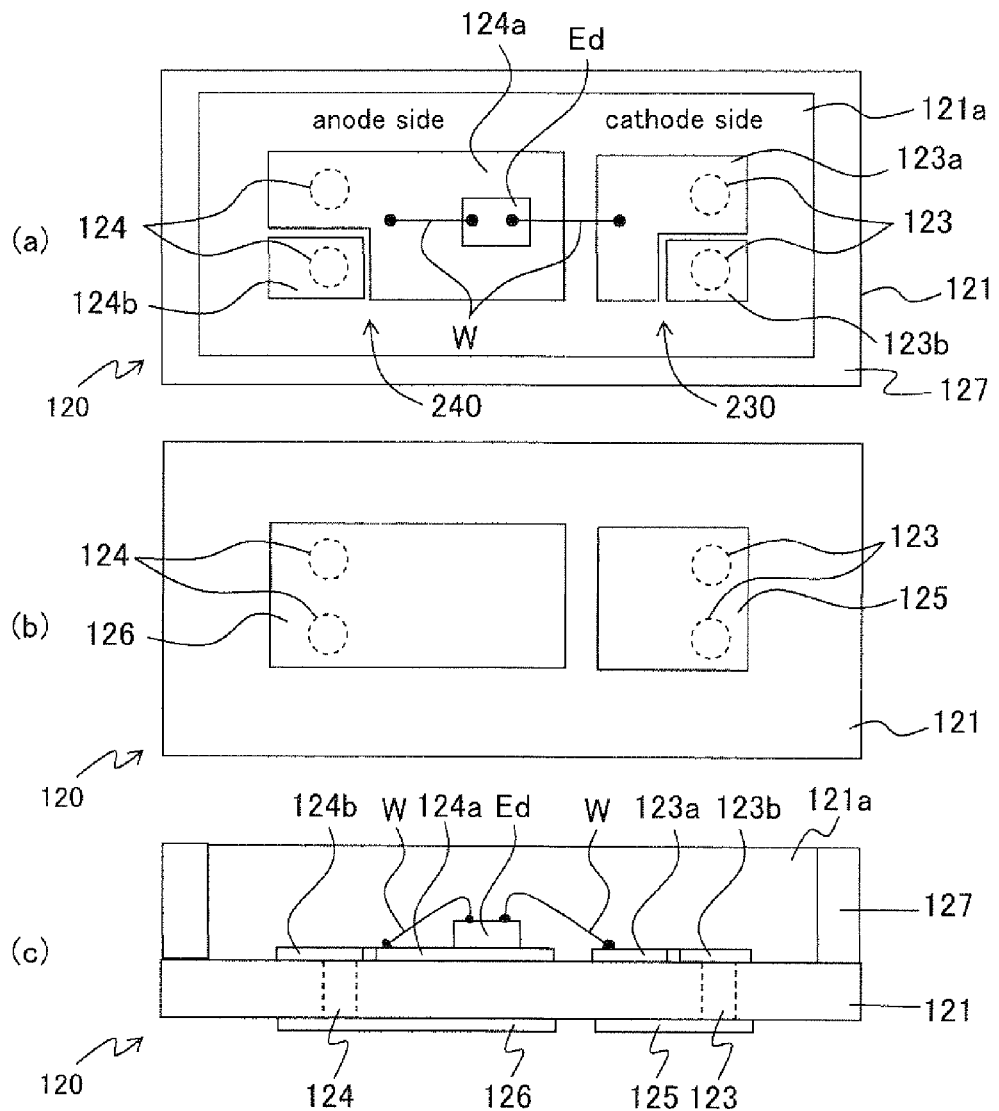
FIG. 5 is a diagram describing a semiconductor apparatus according to Variation Example 1 of Embodiment 3 of the present invention.

FIG. 5 is a diagram describing a semiconductor light emitting apparatus according to Variation Example 1 of Embodiment 3 of the present invention. FIG. 5(a) is a plan view thereof. FIG. 5(b) is a bottom plan view thereof. FIG. 5(c) is a side view thereof.

A semiconductor light emitting apparatus 120 according to Variation Example 1 of Embodiment 3 has a ceramic substrate 121 of a shape of a rectangle in a plan view. A light emitting element (light emitting diode) Ed is implemented on the ceramic substrate 121, and a reflector member 127 is attached on the ceramic substrate 121 in such a manner to surround the light emitting element Ed. Encapsulating resin 121a is filled in the reflector member 127 of the ceramic substrate 121 to encapsulate the light emitting element Ed.

When the insulated substrate is a ceramic substrate as in Variation Example 1 of Embodiment 3, the reflector member 127 can be formed by laminating a ceramic layer on the ceramic substrate, the ceramic layer having an opening corresponding to a region of the ceramic substrate for mounting a light emitting element.

When the insulated substrate is a printed board, a reflector member with a reflecting metal layer formed on a surface thereof can be fixed to the printed board by attaching the reflector member to the insulated substrate.

On the front surface of the ceramic substrate 121, a front surface cathode electrode 230 is arranged, which has a structure consisting of a front surface cathode electrode main body section 123a and a front surface cathode electrode separation section 123b, and from which a part having a generally square shape (lower right part in the page space of FIG. 5(a)) is separated. In addition, on the front surface of the ceramic substrate 121, a front surface anode electrode 240 is arranged, which has a structure consisting of a front surface anode electrode main body section 124a and a front surface anode electrode separation section 124b, and from which a part having a rectangular shape (lower left part in the page space of FIG. 5(a)) is separated.

The light emitting element (light emitting diode) Ed is adhered to the front surface anode electrode main body section 124a with an insulated member (not shown) interposed therebetween. In addition, a cathode electrode (not shown) of the light emitting element Ed is connected with the front surface cathode electrode main body section 123a with a bonding wire W, and an anode electrode (not shown) of the light emitting element Ed is connected with the front surface anode electrode main body section 124a with a bonding wire W.

On the back surface side of the ceramic substrate 121, a back surface cathode electrode 125 is arranged in such a manner as to oppose the separated front surface cathode electrode 230, and the back surface cathode electrode 125 is electrically connected with the front surface cathode electrode main body section 123a and the front surface cathode electrode separation section 123b, through respective through hole penetrating conductors 123.

Similarly, on the back surface side of the ceramic substrate 121, a back surface cathode electrode 126 is arranged in such a manner to oppose the separated front surface anode electrode 240, and the back surface cathode electrode 126 is electrically connected with the front surface anode electrode main body section 124a and the front surface anode electrode separation section 124b, through respective through hole penetrating conductors 124.

When the semiconductor light emitting apparatus 120 with such a structure is mounted on a mounted substrate such as a printed board, the front surface cathode electrode main body section 123a and the front surface cathode electrode separation section 123b in the semiconductor light emitting apparatus 120 are not electrically connected with each other through the conductor layer of the mounted substrate, and the front surface anode electrode main body section 124a and the front surface anode electrode separation section 124b in the semiconductor light emitting apparatus 120 are not electrically connected with each other through the conductor layer of the mounted substrate.

Therefore, upon mounting the semiconductor light emitting apparatus 120, it is necessary to electrically connect the front surface cathode electrode main body section 123a and the front surface cathode electrode separation section 123b with solder as well as to electrically connect the front surface anode electrode main body section 124a and the front surface anode electrode separation section 124b with solder.

In the semiconductor light emitting apparatus 120 according to Variation Example 1 of Embodiment 3 with such a structure, the front surface cathode electrode 230 of the ceramic substrate 121, for example, is structured to be separated into the front surface cathode electrode main body section 123a and the front surface cathode electrode separation section 123b. In addition, the back surface cathode electrode 125 is connected with the front surface cathode electrode main body section 123a and the front surface cathode electrode separation section 123b, with the respective through hole penetrating conductors 123. Therefore, it is possible to suppress the lowering of the yield rate of products because of a bad continuity due to a bad connection between, for example, the through hole penetrating conductor and the front surface cathode electrode. For example, suppose the rate of confirming the occurrence of bad continuity is 50%; even if a bad connection occurs at a point between the through hole penetrating conductor 123 and the front surface cathode electrode main body section 123a, the connection can be secured between another through hole penetrating conductor 123 and the front surface cathode electrode separation section 123b. As a result, the continuity can be secured, and the products will not be defective ones.

Also, with regard to the electrode on the anode side, similarly to the electrode on the cathode side as described above, a bad electrical connection will not occur between the front surface electrode and the back surface electrode of the substrate, thereby suppressing the occurrence of a bad connection due to deterioration over time.

Further, in Variation Example 1 of Embodiment 3, the front surface cathode electrode and the front surface anode electrode are structured to be separated for each through hole penetrating conductor of the ceramic substrate. Accordingly, the application of test voltage in between the separated front surface cathode electrode main body section 123a and front surface cathode electrode separation section 123b makes it possible to detect a bad connection between the front surface cathode electrode 230 and the back surface cathode electrode 125. Further, the application of test voltage in between the separated front surface anode electrode main body section 124a and the front surface anode electrode separation section 124b makes it possible to detect a bad connection between the front surface anode electrode 240 and the back surface cathode electrode 126. As a result, the deterioration over time can be avoided, and a semiconductor light emitting apparatus with high reliability can be provided.

In Variation Example 1 of Embodiment 3, however, since the front surface side of the ceramic substrate 121 is covered with the resin 121a, it is necessary to contrive a way of contacting a probe needle of a disconnection testing apparatus with the separated cathode electrode and anode electrode on the front surface side.

Variation Example 2 of Embodiment 3

Figure 6:
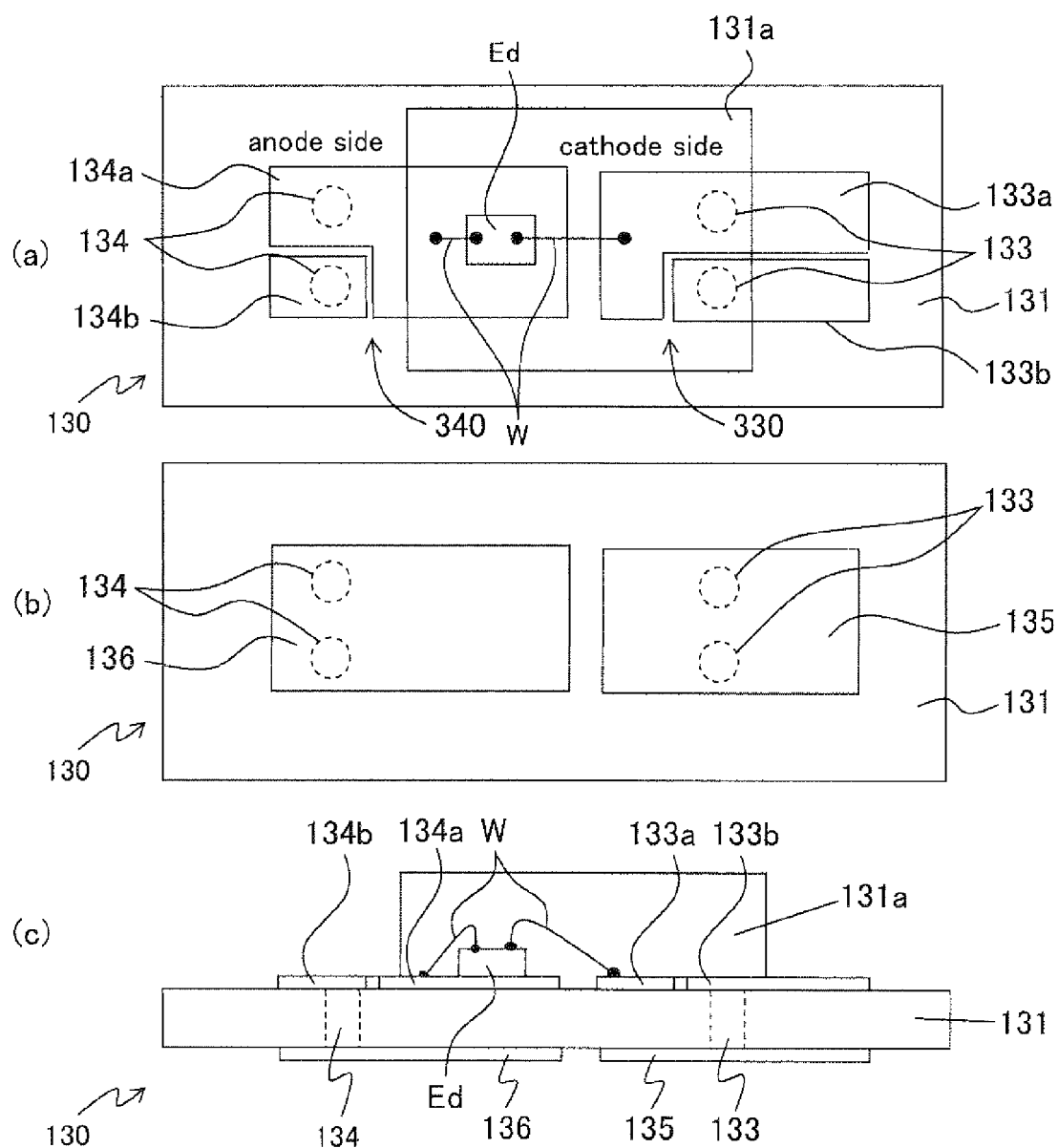
FIG. 6 is a diagram describing a semiconductor apparatus according to Variation Example 2 of Embodiment 3 of the present invention.
Figure 7:
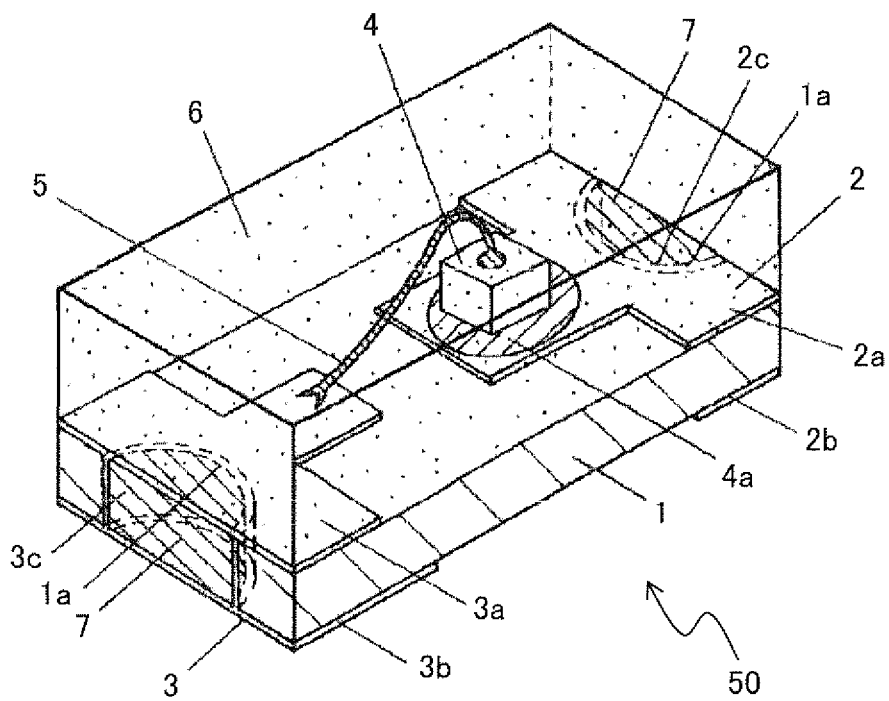
FIG. 7 is a perspective view describing a chip-type LED, which is disclosed in Reference 1.
Figure 8:
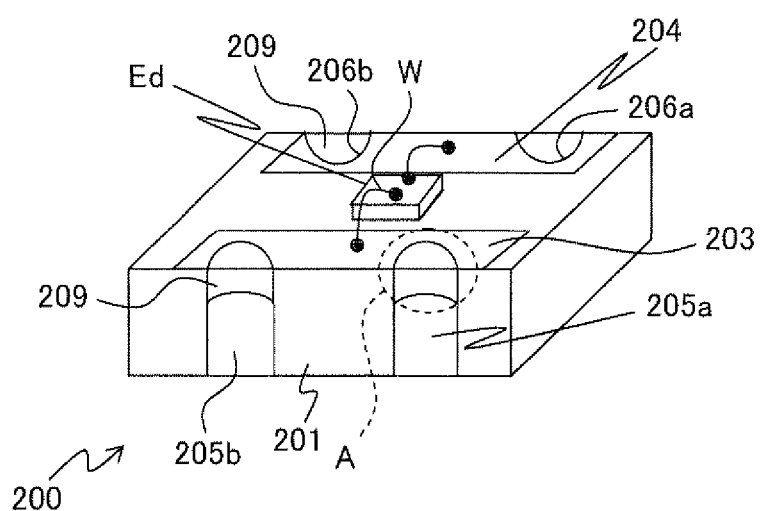
FIG. 8 is a perspective view describing an improved conventional chip-type LED.
Figure 9:
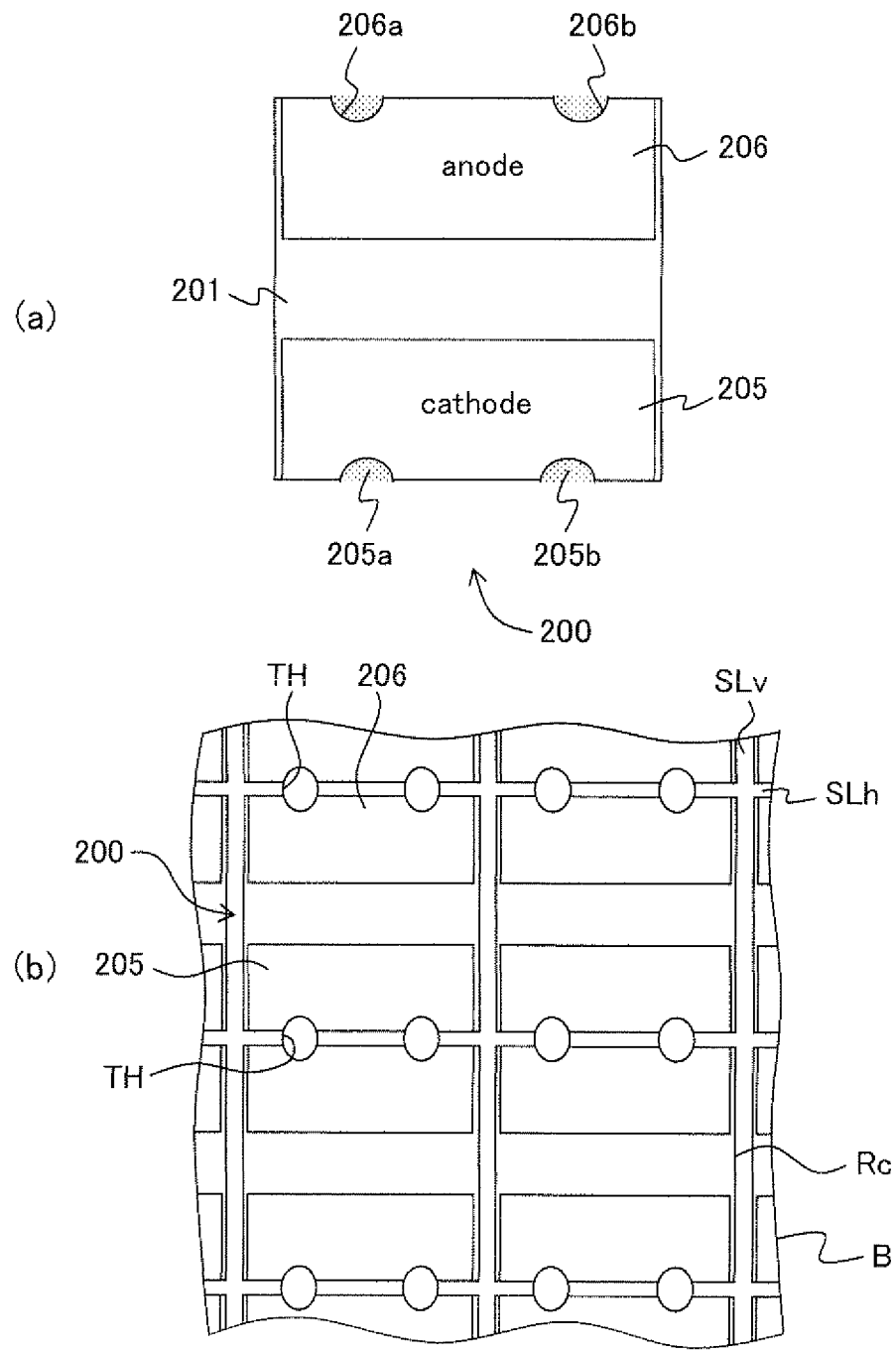
FIG. 9 is a plan view describing an improved conventional chip-type LED, illustrating the one cut out into a chip as a structure of a back surface electrode of the chip-type LED (FIG. 9(a)) and the one before being cut out into a chip (FIG. 9(b)).
Figure 10:
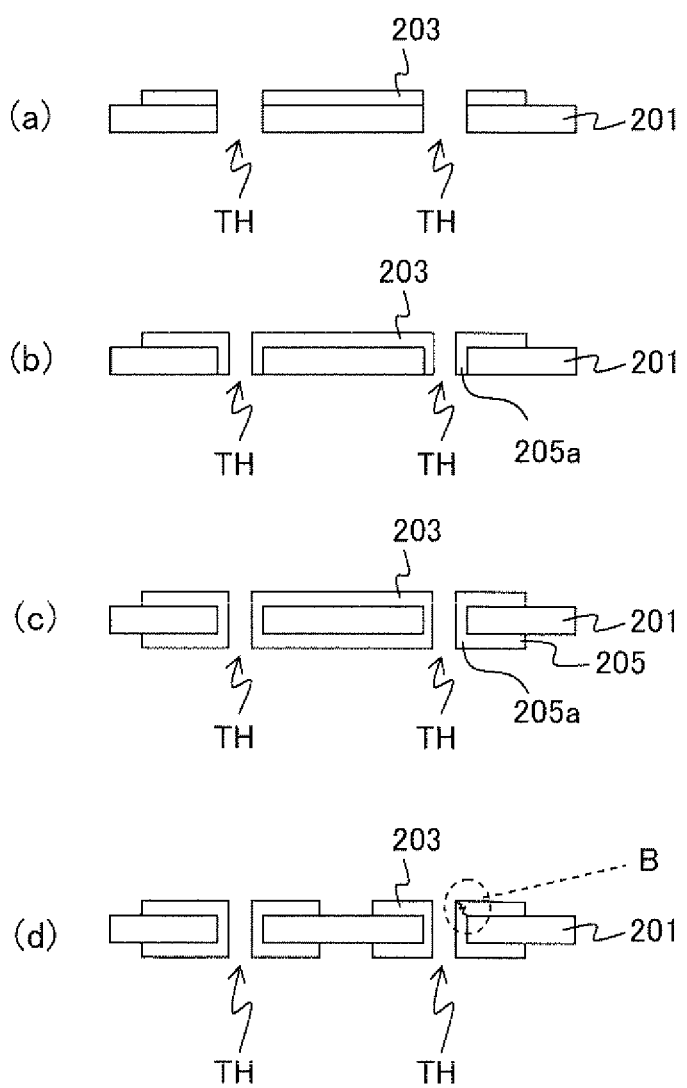
FIG. 10 is a diagram describing a forming process of an electrode of an improved conventional chip-type LED.

FIG. 6 is a diagram describing a semiconductor light emitting apparatus according to Variation Example 2 of Embodiment 3 of the present invention. FIG. 6(a) is a plan view thereof. FIG. 6(b) is a bottom plan view thereof. FIG. 6(c) is a side view thereof.

A semiconductor light emitting apparatus 130 according to Variation Example 2 of Embodiment 3 is obtained by reducing the region of the ceramic substrate encapsulated by encapsulating resin, and by pulling out the front surface cathode electrode main body section, the front surface cathode electrode separation section as well as the front surface anode electrode main body section and the front surface anode electrode separation section, from the encapsulating resin, in the semiconductor light emitting apparatus 120 according to Variation Example 1 of Embodiment 3.

Specifically, the semiconductor light emitting apparatus 130 according to Variation Example 2 of Embodiment 3 has a ceramic substrate 131 in the shape of a rectangle in a plan view. A light emitting element (light emitting diode) Ed is implemented on the ceramic substrate 131, and the light emitting element Ed is encapsulated with resin 131a.

On the front surface of the ceramic substrate 131, a front surface cathode electrode 330 is arranged, which has a structure consisting of a front surface cathode electrode main body section 133a and a front surface cathode electrode separation section 133b, and from which a part having the shape of a rectangle (the lower right part in the page space of FIG. 6(a)) is separated. In addition, on the front surface of the ceramic substrate 131, a front surface anode electrode 340 is arranged, which has a structure consisting of a front surface anode electrode main body section 134a and a front surface anode electrode separation section 134b, and from which a part of a shape of a rectangle (lower left part in the page space of FIG. 6(a)) is separated.

The light emitting element (light emitting diode) Ed is adhered to the front surface anode electrode main body section 134a with an insulated member (not shown) interposed therebetween. In addition, a cathode electrode (not shown) of the light emitting element Ed is connected with the front surface cathode electrode main body section 133a with a bonding wire W, and an anode electrode (not shown) of the light emitting element Ed is connected with the front surface anode electrode main body section 134a with a bonding wire W.

On the back surface side of the ceramic substrate 131, a back surface side cathode electrode 135 is arranged in such a manner to oppose the separated front surface cathode electrode 330, and the back surface cathode electrode 135 is connected with the front surface cathode electrode main body section 133a and the front surface cathode electrode separation section 133b, through respective through hole penetrating conductors 133.

Similarly, on the back surface side of the ceramic substrate 131, a back surface cathode electrode 136 is arranged in such a manner to oppose the separated front surface anode electrode 340, and the back surface cathode electrode 136 is connected with the front surface anode electrode main body section 134a and the front surface anode electrode separation section 134b, through respective through hole penetrating conductors 134.

When the semiconductor light emitting apparatus 130 with such a structure is mounted on a mounted substrate such as a printed board, the front surface cathode electrode main body section 133a and the front surface cathode electrode separation section 133b in the semiconductor light emitting apparatus 130 are not electrically connected with each other through the conductor layer of the mounted substrate, and the front surface anode electrode main body section 134a and the front surface anode electrode separation section 134b in the semiconductor light emitting apparatus 130 are not electrically connected with each other through the conductor layer of the mounted substrate.

Therefore, upon mounting the semiconductor light emitting apparatus 130, it is necessary to electrically connect the front surface cathode electrode main body section 133a and the front surface cathode electrode separation section 133b with solder as well as to electrically connect the front surface anode electrode main body section 134a and the front surface anode electrode separation section 134b with solder.

In the semiconductor light emitting apparatus 130 according to Variation Example 2 of Embodiment 3 with such a structure, the front surface cathode electrode 330 of the ceramic substrate is structured to be separated into the front surface cathode electrode main body section 133a and the front surface cathode electrode separation section 133b. In addition, the back surface cathode electrode 135 is connected with the front surface cathode electrode main body section 133a and the front surface cathode electrode separation section 133b, with the respective through hole penetrating conductors 133. Therefore, it is possible to suppress the lowering of the yield rate of products because of a bad continuity due to a bad connection between, for example, the through hole penetrating conductor and the front surface cathode electrode. For example, suppose the rate of confirming the occurrence of bad continuity is 50%, even if a bad connection occurs at a point between the through hole penetrating conductor 133 and the front surface cathode electrode main body section 133a, the connection can be secured between another through hole penetrating conductor 133 and the front surface cathode electrode separation section 133b. As a result, the continuity can be secured, and the products will not be defective ones.

In addition, the connection between the front surface anode electrode 340 and the back surface cathode electrode 136 can also be highly reliable.

Further, in Variation Example 2 of Embodiment 3, the front surface cathode electrode 330 and the front surface anode electrode 340 are structured to be separated for each through hole penetrating conductor of the ceramic substrate. Accordingly, the application of test voltage in between the separated front surface cathode electrode main body section 133a and the front surface cathode electrode separation section 133b makes it possible to detect a bad connection in a path from the front surface cathode electrode main body section 133a to the through hole penetrating conductor 133, the back surface cathode electrode 135, the through hole penetrating conductor 133, and to the front surface cathode electrode separation section 133b. Further, the application of test voltage in between the separated front surface anode electrode main body section 134a and the front surface anode electrode separation section 134b makes it possible to detect a bad connection in a path from the front surface anode electrode main body section 134a to the through hole penetrating conductor 134, the back surface cathode electrode 136, the through hole penetrating conductor 134, and to the front surface cathode electrode separation section 134b. As a result, the deterioration over time can be avoided, and a semiconductor light emitting apparatus with high reliability can be provided.

As described above, the present invention is exemplified by the use of its preferred Embodiments. However, the present invention should not be interpreted solely based on the Embodiments described above. The present invention can also be applied to a semiconductor apparatus which uses a substrate comprising a penetrating electrode, with the back surface of the substrate used as an implementation surface, and which has a semiconductor chip covered with an encapsulating body on the substrate.

In addition, such a semiconductor light emitting apparatus as described above can be mounted on a mounted substrate to form an illumination module, or an electronic device (electric device) with the semiconductor apparatus described above equipped therein as an IC part that can be configured, so that an illumination module or an electronic device with high reliability can be provided.

It is understood that the scope of the present invention should be interpreted solely based on the claims. It is also understood that those skilled in the art can implement equivalent scope of technology, based on the description of the present invention and common knowledge from the description of the detailed preferred Embodiments of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a semiconductor apparatus of a surface mounting type, in which a semiconductor chip, such as an LED (Light Emitting Diode) chip, is implemented on an insulated substrate; a method for inspecting such a semiconductor apparatus; and an electric device using such a semiconductor apparatus. According to the present invention as described above, the electrode structure of the insulated substrate, which constitutes the front surface implementing type device, in which a semiconductor chip is implemented on the insulated substrate, is formed to have an electrode structure of high reliability, in which the front surface electrode and the back surface electrode thereof are connected with each another through a plurality of connection electrodes. Further, in such an electrode structure, inspection for a bad connection can be reliably performed between the front surface electrode or back surface electrode and any of the plurality of connection electrodes. As a result, the present invention provides a semiconductor apparatus and an inspection method thereof, capable of providing LED devices or IC parts of high reliability and with minimal deterioration over time, as well as an electric device using such a semiconductor apparatus.

Various other modifications will be apparent to, and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor apparatus with a semiconductor element implemented on an insulated substrate, comprising:
   a substrate front surface electrode formed on a front surface side of the insulated substrate and connected with an element electrode of the semiconductor element;
   a substrate back surface electrode formed on a back surface side of the insulated substrate and electrically connected with the substrate front surface electrode; and
   a plurality of connection electrodes, extending in a thickness direction of the insulated substrate from one side to the other side of a front surface and a back surface of the insulated substrate, for electrically connecting the substrate front surface electrode with the substrate back surface electrode,
   wherein one of the substrate front surface electrode and the substrate back surface electrode is formed to have a plane pattern separated for each of the plurality of connection electrodes, the other of the substrate front surface electrode and the substrate back surface electrode is formed to have a continuous single plane pattern, which is electrically connected with all of the plurality of connection electrodes.

2. A semiconductor apparatus according to claim 1, wherein the substrate front surface electrode is formed to have a continuous single plane pattern, which is electrically connected with all of the plurality of connection electrodes; and the substrate back surface electrode is formed to have a plane pattern separated for each of the plurality of connection electrodes.

3. A semiconductor apparatus according to claim 1, wherein the substrate front surface electrode is formed to have a plane pattern separated for each of the plurality of connection electrodes; and the substrate back surface electrode is formed to have a continuous single plane pattern, which is electrically connected with all of the plurality of connection electrodes.

4. A semiconductor apparatus according to claim 2, wherein:
   the semiconductor apparatus comprises encapsulating resin for encapsulating the semiconductor element arranged on the insulated substrate;
   a cutout part is formed in a side surface of the insulated substrate, extending from one side to the other side of the front surface and the back surface of the insulated substrate; and
   the plurality of connection electrodes are a plurality of side surface electrodes which formed on a front surface of the cutout part, for electrically connecting the substrate front surface electrode with the substrate back surface electrode.

5. A semiconductor apparatus according to claim 4, wherein a connection part between the side surface electrode and the substrate front surface electrode is covered with an insulation film, the insulation film being formed to prevent the encapsulating resin from entering the cutout part in which the side surface electrode is formed.

6. A semiconductor apparatus according to claim 2, wherein the semiconductor apparatus has a through hole formed in the insulated substrate, extending from one side to the other side of the front surface and the back surface of the insulated substrate; and the connection electrodes are a plurality of connection electrodes each formed on an internal surface of the through hole, for electrically connecting the substrate front surface electrode with the substrate back surface electrode.

7. A semiconductor apparatus according to claim 5,
   wherein the substrate front surface electrode comprises:
   a first substrate front surface electrode formed on the front surface side of the insulated substrate and connected with a first element electrode of the semiconductor element; and
   a second substrate front surface electrode formed on the front surface side of the insulated substrate and connected with a second element electrode of the semiconductor element;
   wherein the substrate back surface electrode comprises:
   a first substrate back surface electrode formed on the back surface side of the insulated substrate and electrically connected with the first substrate front surface electrode; and
   a second substrate back surface electrode formed on the back surface side of the insulated substrate and electrically connected with the second substrate front surface electrode;
   wherein the side surface electrode comprises:
   a plurality of first side surface electrodes extending in the thickness direction of the insulated substrate from one side to the other side of the front surface and the back surface of the insulated substrate, for electrically connecting the first substrate front surface electrode and the first substrate back surface electrode; and
   a plurality of second side surface electrodes extending in the thickness direction of the insulated substrate from one side to the other side of the front surface and the back surface of the insulated substrate, for electrically connecting the second substrate front surface electrode and the second substrate back surface electrode;

wherein the first substrate back surface electrode is formed to have a plane pattern separated for each of the plurality of first side surface electrodes, and wherein the second substrate back surface electrode is formed to have a plane pattern separated for each of the plurality of second side surface electrodes.

8. A semiconductor apparatus according to claim 7, wherein:

the semiconductor element is a light emitting diode having a cathode electrode as the first element electrode, and having an anode electrode as the second element electrode;

the cathode electrode as the first element electrode is connected with the first substrate front surface electrode; and the anode electrode as the second element electrode is connected with the second substrate front surface electrode.

9. A semiconductor apparatus according to claim 8, wherein:

the first substrate front surface electrode connected with the cathode electrode is connected with the first substrate back surface electrode with two of the first side surface electrodes interposed therebetween; and the second substrate front surface electrode connected with the anode electrode is connected with the second substrate back surface electrode with two of the second side surface electrodes interposed therebetween.

10. A semiconductor apparatus according to claim 1, wherein the substrate front surface electrode and the substrate back surface electrode are arranged in such a manner not to overlap a scribe line for scribing the insulated substrate, the scribe line being established on the insulated substrate.

11. A semiconductor apparatus according to claim 3, wherein:

the semiconductor apparatus has an encapsulating body formed above the insulated substrate in such a manner to cover the semiconductor element, for encapsulating the semiconductor element; and the substrate front surface electrode is formed in such a manner to reach outside of the encapsulating body from the inside thereof.

12. A semiconductor apparatus according to claim 1, wherein the insulated substrate is a ceramic substrate.

13. A method for inspecting the semiconductor apparatus according to claim 1, comprising:

a step of applying voltage in between parts corresponding to two separated plane patterns of the substrate front surface electrode when the substrate front surface electrode has a plane pattern separated for each of the plurality of connection electrodes, and applying voltage in between parts corresponding to two separated plane patterns of the substrate back surface electrode when the substrate back surface electrode has a plane pattern separated for each of the plurality of connection electrodes; and a step of confirming a continuity state between the plurality of connection electrodes, and the substrate front surface electrode and the substrate back surface electrode, based on a current value generated at the step of applying voltage.

14. An electric device comprising a semiconductor apparatus, wherein the semiconductor apparatus is a semiconductor apparatuses according to claim 1.

* * * * *